(12) United States Patent
Jha et al.

(10) Patent No.: US 8,900,940 B2
(45) Date of Patent: Dec. 2, 2014

(54) REDUCING GATE HEIGHT VARIANCE DURING SEMICONDUCTOR DEVICE FORMATION

(71) Applicant: GLOBALFOUNDRIES Inc., Grand Cayman (KY)

(72) Inventors: Ashish K. Jha, Clifton Park, NY (US); Tae-Hoon Kim, Malta, NY (US); Tae Hoon Lee, Clifton Park, NY (US); Chang Ho Maeng, Clifton Park, NY (US); Songkram Srivathanakul, Waterford, NY (US); Haiting Wang, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 63 days.

(21) Appl. No.: 13/738,270

(22) Filed: Jan. 10, 2013

(65) Prior Publication Data
US 2014/0193957 A1   Jul. 10, 2014

(51) Int. Cl.
*H01L 21/338* (2006.01)
*H01L 21/8238* (2006.01)

(52) U.S. Cl.
CPC .. *H01L 21/823828* (2013.01); *H01L 21/82385* (2013.01); *H01L 21/823864* (2013.01)
USPC ............ 438/183; 438/184; 438/229; 438/674

(58) Field of Classification Search
CPC .................................................... H01L 21/8238
USPC .......................... 438/183, 184, 674, 926, 229
See application file for complete search history.

(56) References Cited

U.S. PATENT DOCUMENTS

| | | | |
|---|---|---|---|
| 4,912,061 A | 3/1990 | Nasr | |
| 7,405,116 B2* | 7/2008 | Carter et al. | 438/183 |
| 2011/0281409 A1* | 11/2011 | Ellis-Monaghan et al. | 438/229 |
| 2012/0083121 A1 | 4/2012 | Ando et al. | |

* cited by examiner

*Primary Examiner* — Alexander Ghyka
(74) *Attorney, Agent, or Firm* — Hunter E. Webb; Keohane & D'Alessandro, PLLC

(57) ABSTRACT

In general, aspects of the present invention relate to approaches for forming a semiconductor device such as a FET with reduced gate stack height variance. Specifically, when a gate stack height variance is detected/identified between a set of gate stacks, a hard mask layer and sets of spacers are removed from the uneven gate stacks leaving behind (among other things) a set of dummy gates. A liner layer and an inter-layer dielectric are formed over the set of dummy gates. The liner layer is then removed from a top surface (or at least a portion thereof) of the set of dummy gates, and the set of dummy gates are then removed. The result is a set of gate regions having less height variance/disparity.

20 Claims, 5 Drawing Sheets

REDUCING GATE HEIGHT VARIANCE DURING SEMICONDUCTOR DEVICE FORMATION

BACKGROUND

1. Technical Field

This invention relates generally to the field of semiconductors and, more particularly, to approaches for removing gate height variances in devices such as field effect transistors (FETs).

2. Related Art

During fabrication, semiconductor devices such as FETs often include a stage in which a dummy gate is formed and later removed. Various layers such as hard mask layers, spacers, etc., may be formed over/around the dummy gates. In many cases, this leads to an uneven gate stack height among the gate stacks. Such a condition is then propagated through the various stages of device formation that follow. For example, when the dummy gates are later removed, the uneven height that existed often leads to uneven spacer heights. This can lead to performance issues unless corrected before the device formation is completed.

SUMMARY

In general, aspects of the present invention relate to approaches for forming a semiconductor device such as a FET with reduced gate stack height variance. Specifically, when a gate stack height variance is detected/identified between a set of gate stacks, a hard mask layer and sets of spacers are removed from the uneven gate stacks leaving behind (among other things) a set of dummy gates. A liner layer and an inter-layer dielectric are formed over the set of dummy gates. The liner layer is then removed from a top surface (or at least a portion thereof) of the set of dummy gates, and the set of dummy gates are then removed. The result is a set of gate regions having less height variance/disparity.

A first aspect of the present invention provides a method for reducing gate height variance in a semiconductor device, comprising: removing a hard mask layer and a set of spacers from a set of dummy gates; depositing a liner layer and an inter-layer dielectric (ILD) over the set of dummy gates; removing the liner layer from at least a portion of a top surface of the set of dummy gates; and removing the set of dummy gates.

A second aspect of the present invention provides a method for reducing gate height variance in a semiconductor device, comprising: removing a hard mask layer and a set of spacers from a first gate stack and a second gate stack, the first gate stack having a first dummy gate, and the second gate stack having a second dummy gate; depositing a liner layer and an inter-layer dielectric (ILD) over the first dummy gate and the second dummy gate; removing the liner layer from at least a portion of a top surface of the first dummy gate and the second dummy gate; and removing the set of dummy gates to reduce a height variance between the first gate stack and the second gate stack.

A third aspect of the present invention provides a method for reducing gate height variance in a semiconductor device, comprising: identifying a height variance between a first gate stack and a second gate stack of a semiconductor device, the first gate stack having a first dummy gate and the second gate stack having a second dummy gate; removing a hard mask layer and a set of spacers from the first gate stack and the second gate stack; depositing a liner layer and an inter-layer dielectric (ILD) over the first dummy gate and the second dummy gate; removing the liner layer from at least a portion of a top surface of the first dummy gate and the second dummy gate; and removing the set of dummy gates to reduce the height differential between the first gate stack and the second gate stack.

BRIEF DESCRIPTION OF THE DRAWINGS

These and other features of this invention will be more readily understood from the following detailed description of the various aspects of the invention taken in conjunction with the accompanying drawings in which.

Figure 1:
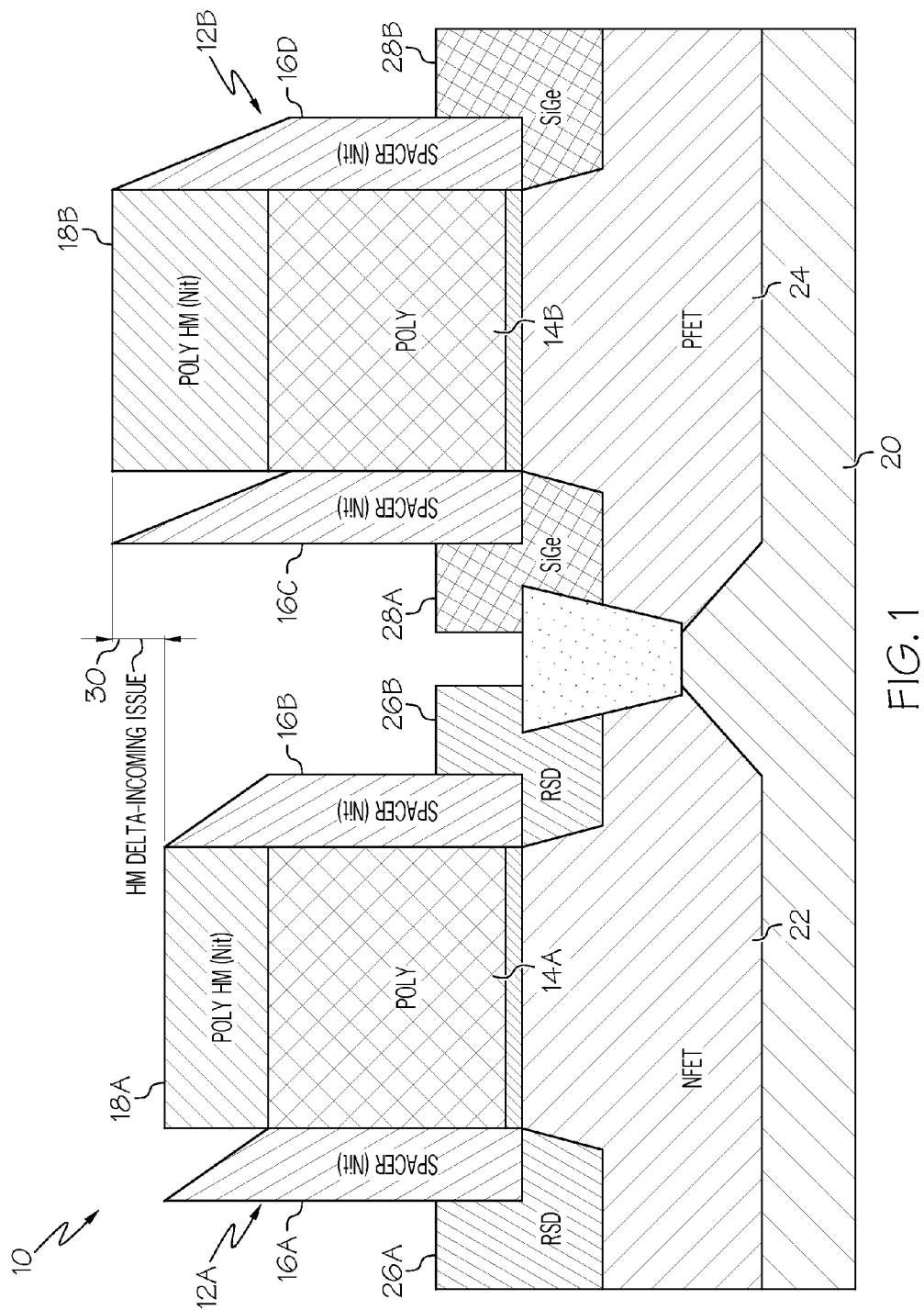
FIG. 1 shows a semiconductor device having a gate stack height variance according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, aspects of the present invention relate to approaches for forming a semiconductor device such as a FET with reduced gate stack height variance. Specifically, when a gate stack height variance is detected/identified between a set of gate stacks, a hard mask layer and sets of spacers are removed from the uneven gate stacks leaving behind (among other things) a set of dummy gates. A liner layer and an inter-layer dielectric are formed over the set of dummy gates. The liner layer is then removed from a top surface (or at least a portion thereof) of the set of dummy gates, and the set of dummy gates are then removed. The result is a set of gate regions having less height variance/disparity.

Referring now to FIG. 1, a semiconductor device 10 according to an embodiment of the present invention is shown. As depicted, device 10 may include a set of gate stacks 12A-B formed over substrate 20. Gate stacks 12A-B may include dummy gates 14A-B (e.g., poly silicon), spacers 16A-D and hard mask layers 18A-B (e.g., poly nitride). As further shown, device 10 may include NFET region 22, PFET region 24, reversely switched disinters (RSDS) 26A-B, and silicon germanium (SiGe) regions 28A-B. It is understood that these layers/components are intended to be illustrative only and that other layers and/or materials may exist in device 10. Regardless, as shown, gate stacks 12A-B have a height variance/differential 30. In the example shown, gate stack 12A is shorter than gate stack 12B. As indicated above, that may lead to device performance issues.

Figure 2:
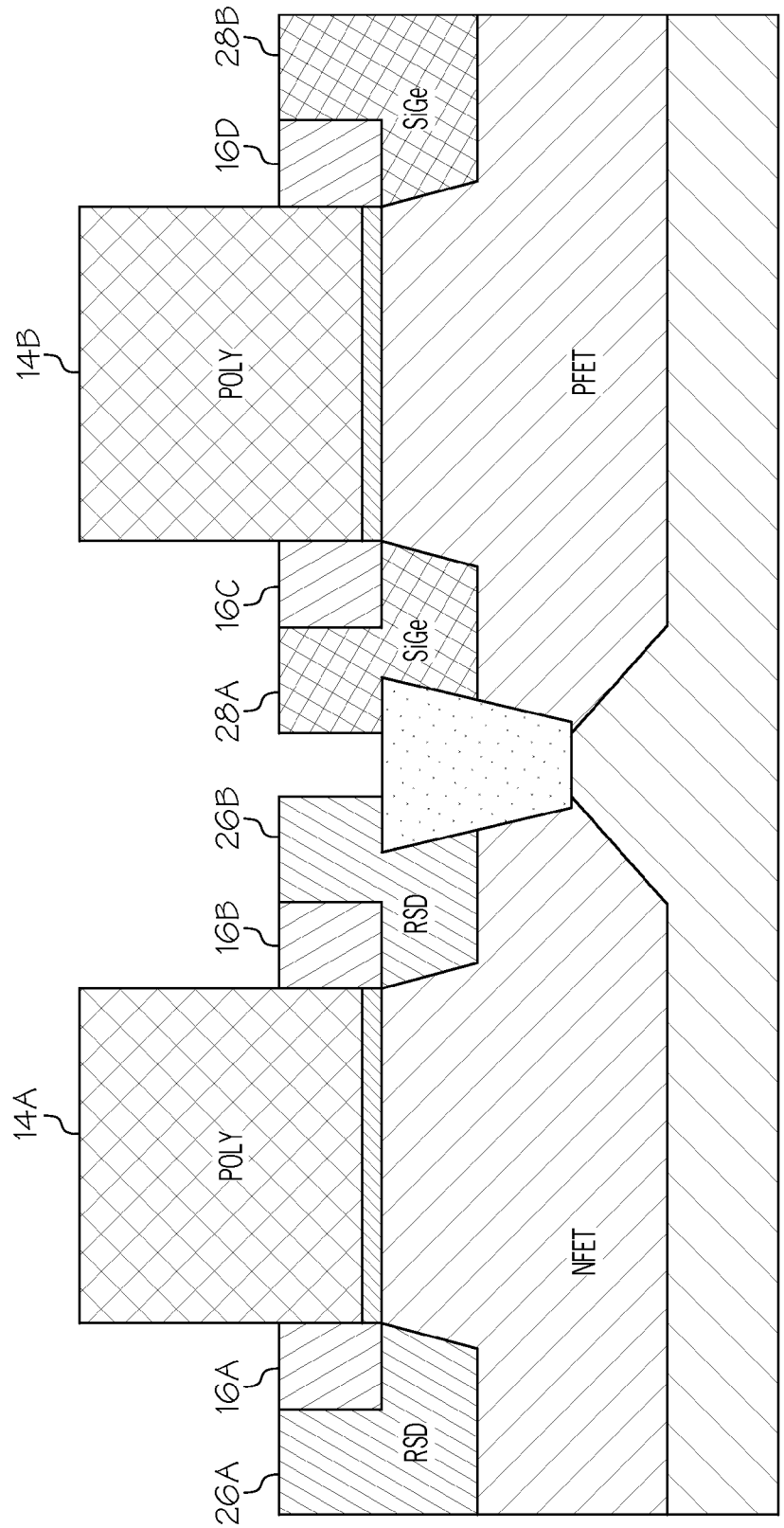
FIG. 2 shows a removal of a hard mask layer and spacers from the device of FIG. 1 according to an embodiment of the present invention.
Figure 3:
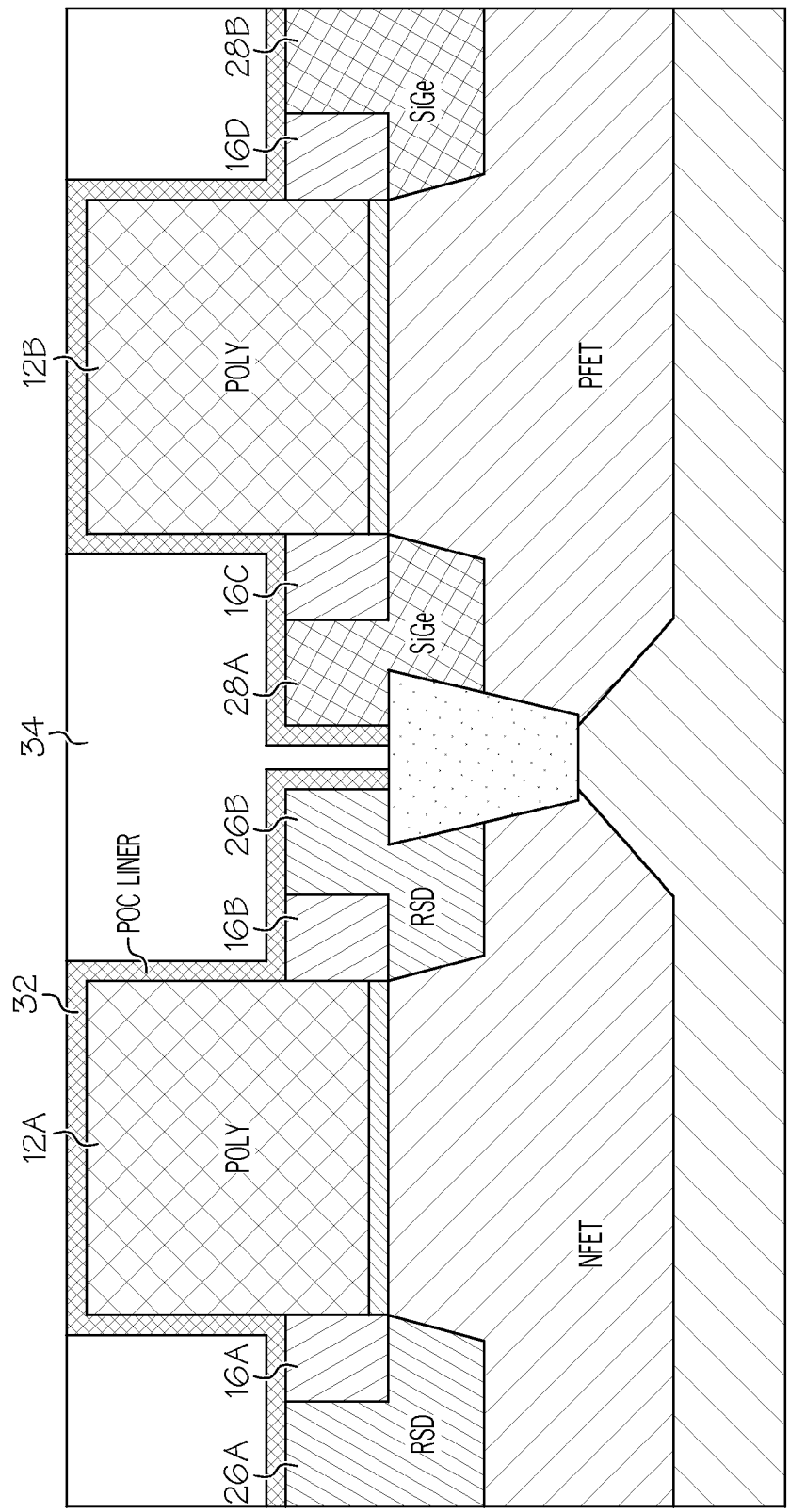
FIG. 3 shows a deposit of a liner layer and an inter-layer dielectric to the device of FIG. 2 according to an embodiment of the present invention.
Figure 4:
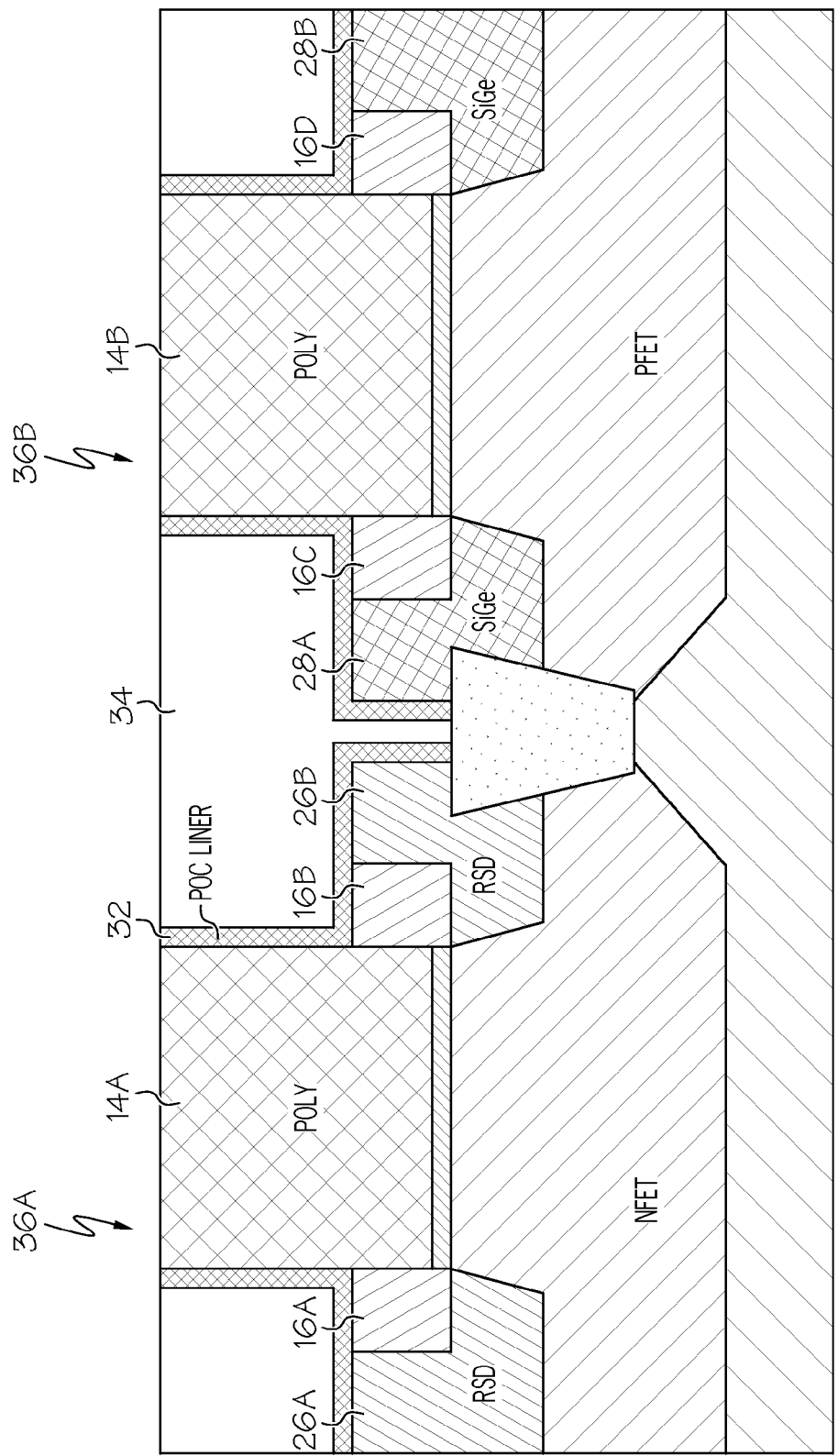
FIG. 4 shows partial removal of the liner layer from the device of FIG. 1 according to an embodiment of the present invention.
Figure 5:
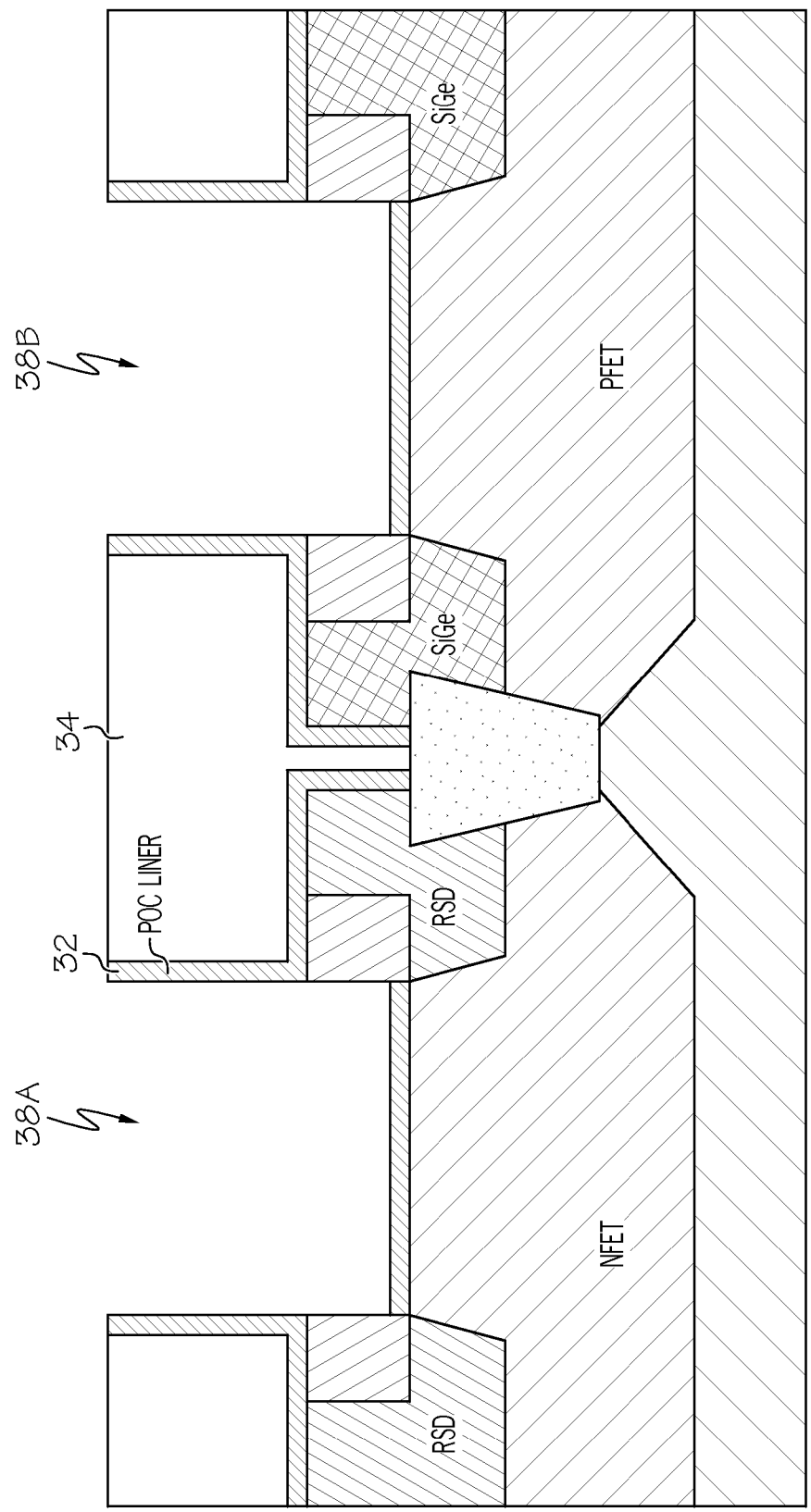
FIG. 5 shows removal of the dummy gates from the gate stacks of the device of FIG. 1 according to an embodiment of the present invention.

To address the differential 30, a set of additional processing steps may be taken hereunder. Referring to FIG. 2, it is shown that the spacers 16A-D and hard mask layer 18A-B shown in FIG. 1 have been stripped from gate stacks 12A-B (remaining only within RSD 26A-B and SiGe 28A-B regions). Then, as shown in FIG. 3, a liner layer 32 (e.g., nitride) and an inter-layer dielectric (ILD) 34 will be deposited. Specifically, as shown, liner layer 32 is applied along the top surface and side surfaces of dummy gates 14A-D as well as along the top surfaces of: spacers 16A-D, RSD regions 28A-B, and SiGe regions 28A-B. ILD 34 is then deposited over the liner layer 32 and polished (e.g., via chemical-mechanical polishing (CMP)). As then shown in FIG. 4, liner layer 32 is removed from top surfaces 36A-B of dummy gates 14A-B (e.g., by reactive ion etch (RIE), CMP, etc.), but is allowed to remain along the side walls of dummy gates 14A-B, as well as the top surfaces of spacers 16A-D, RSD regions 28A-B, and SiGe regions 28A-B. Then, as shown in FIG. 5, the dummy gates (14A-B) can be removed leaving liner layer 32 and ILD 34 forming gate region/areas 38A-B. As shown, gate areas 38A-B no longer have the height differential 30 shown in FIG. 1.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for reducing gate height variance in a semiconductor device, comprising:

removing a hard mask layer and a set of spacers from a set of dummy gates, the removal of the hard mask layer and the set of spacers resulting in exposed surfaces comprising substantially an entirety of a top surface of each dummy gate of the set of dummy gates and at least a portion of side surfaces of each dummy gate;

depositing a liner layer and an inter-layer dielectric (ILD) over the set of dummy gates, the liner layer covering substantially an entirety of the exposed surfaces of each dummy gate;

removing the liner layer from substantially all of the top surface of the set of dummy gates; and removing the set of dummy gates.

2. The method of claim 1, the semiconductor device comprising a transistor.

3. The method of claim 2, the transistor comprising:
a substrate;
a NFET region formed over the substrate; and
a PFET region formed over the substrate.

4. The method of claim 3, further comprising:
a set of reversely switched dinistors (RSDs) in the NFET region; and
a set of silicon germanium (SiGe) regions in the PFET region.

5. The method of claim 1, the set of dummy gates comprising poly silicon.

6. The method of claim 1, the liner layer comprising nitride.

7. The method of claim 1, further comprising polishing the ILD.

8. The method of claim 1, the liner layer being removed via polishing or etching.

9. The method of claim 1, further comprising a semiconductor device formed according to the method of claim 1.

10. A method for reducing gate height variance in a semiconductor device, comprising:
removing a hard mask layer and a set of spacers from a first gate stack and a second gate stack, the first gate stack having a first dummy gate, and the second gate stack having a second dummy gate, the removal of the hard mask layer and the set of spacers resulting in exposed surfaces comprising substantially an entirety of a top surface of each of the first and second dummy gates and at least a portion of side surfaces of each of the first and second dummy gates;
depositing a liner layer and an inter-layer dielectric (ILD) over the first dummy gate and the second dummy gate, the liner layer covering substantially an entirety of the exposed surfaces of each of the first and second dummy gates;
removing the liner layer from substantially all of the top surface of the first dummy gate and the second dummy gate; and
removing the set of dummy gates to reduce a height variance between the first gate stack and the second gate stack.

11. The method of claim 10, the semiconductor device comprising a transistor.

12. The method of claim 11, the transistor comprising:
a substrate;
a NFET region formed over the substrate; and
a PFET region formed over the substrate.

13. The method of claim 12, further comprising:
a set of reversely switched dinistors (RSDs) in the NFET region; and
a set of silicon germanium (SiGe) regions in the PFET region.

14. The method of claim 10, the set of dummy gates comprising poly silicon.

15. The method of claim 10, the liner layer comprising nitride.

16. The method of claim 10, further comprising polishing the ILD.

17. The method of claim 10, the liner layer being removed via polishing or etching.

18. The method of claim 10, further comprising a semiconductor device formed according to the method of claim 1.

19. A method for reducing gate height variance in a semiconductor device, comprising:
identifying a height variance between a first gate stack and a second gate stack of a semiconductor device, the first gate stack having a first dummy gate and the second gate stack having a second dummy gate;
removing a hard mask layer and a set of spacers from the first gate stack and the second gate stack, the removal of the hard mask layer and the set of spacers resulting in exposed surfaces comprising substantially an entirety of a top surface of each of the first and second dummy gates and at least a portion of side surfaces of each of the first and second dummy gates;
depositing a liner layer and an inter-layer dielectric (ILD) over the first dummy gate and the second dummy gate, the liner layer covering substantially an entirety of the exposed surfaces of each of the first and second dummy gates;
removing the liner layer from at least substantially all of the top surface of the first dummy gate and the second dummy gate; and
removing the set of dummy gates to reduce the height differential between the first gate stack and the second gate stack.

20. The method of claim 19, further comprising a semiconductor device formed according to the method of claim 1.

* * * * *